(12) United States Patent
Nakaoka et al.

(10) Patent No.: US 11,682,568 B2
(45) Date of Patent: Jun. 20, 2023

(54) SUBSTRATE TREATMENT APPARATUS AND MANUFACTURING METHOD OF SEMICONDUCTOR DEVICE

(71) Applicant: Kioxia Corporation, Tokyo (JP)

(72) Inventors: Satoshi Nakaoka, Yokkaichi (JP); Yuji Hashimoto, Kuwana (JP); Hiroshi Fujita, Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/198,728

(22) Filed: Mar. 11, 2021

(65) Prior Publication Data
US 2022/0068673 A1 Mar. 3, 2022

(30) Foreign Application Priority Data
Aug. 26, 2020 (JP) .............................. JP2020-142920

(51) Int. Cl.
*H01L 21/67* (2006.01)
*H01L 21/311* (2006.01)
*H01L 21/673* (2006.01)

(52) U.S. Cl.
CPC .. *H01L 21/67086* (2013.01); *H01L 21/31111* (2013.01); *H01L 21/673* (2013.01)

(58) Field of Classification Search
CPC ......... H01L 21/67017; H01L 21/67023; H01L 21/67063
See application file for complete search history.

(56) References Cited

U.S. PATENT DOCUMENTS

| 2004/0152319 | A1 | 8/2004 | Yamagata et al. |
| 2007/0221254 | A1* | 9/2007 | Izumi ................ H01L 21/02041 |
| | | | 134/94.1 |
| 2019/0172734 | A1* | 6/2019 | Honda ............. H01L 21/67173 |
| 2019/0259639 | A1 | 8/2019 | Nakaoka et al. |
| 2020/0006093 | A1* | 1/2020 | Lin ................... H01L 21/68742 |
| 2020/0273726 | A1 | 8/2020 | Nakaoka et al. |
| 2020/0273727 | A1 | 8/2020 | Nakaoka et al. |
| 2021/0280438 | A1 | 9/2021 | Sato et al. |

FOREIGN PATENT DOCUMENTS

| JP | 61-97836 A | 5/1986 |
| JP | 2002-231690 A | 8/2002 |
| JP | 2003-332296 A | 11/2003 |

(Continued)

OTHER PUBLICATIONS

U.S. Appl. No. 17/119,043, filed Dec. 11, 2020, Katsuhiro Sato et al.

*Primary Examiner* — Jae Lee
(74) *Attorney, Agent, or Firm* — Oblon, McClelland, Maier & Neustadt, L.L.P.

(57) ABSTRACT

A substrate treatment apparatus according to an embodiment includes: a tank configured to store a liquid chemical with which a plurality of substrates are treated; a piping having an ejection port that ejects the liquid chemical or bubbles into the tank; a plurality of rods that support the plurality of substrates in the tank; and a converter that is provided in the plurality of rods or the tank and that converts vibration applied to each substrate by the liquid chemical or the bubbles ejected from the piping into rotation in one direction around a center of the substrate as a rotational axis.

4 Claims, 12 Drawing Sheets

(56) References Cited

FOREIGN PATENT DOCUMENTS

| | | |
|---|---|---|
| JP | 2004-207503 A | 7/2004 |
| JP | 2005-142309 A | 6/2005 |
| JP | 4390650 B2 | 12/2009 |
| JP | 2019-145686 A | 8/2019 |
| JP | 2020-136537 A | 8/2020 |
| JP | 2020-141006 A | 9/2020 |
| JP | 2021-141208 A | 9/2021 |

* cited by examiner

SUBSTRATE TREATMENT APPARATUS AND MANUFACTURING METHOD OF
SEMICONDUCTOR DEVICE

CROSS-REFERENCE TO RELATED
APPLICATIONS

This application is based upon and claims the benefit of priority from Japanese Patent Application No. 2020-142920, filed on Aug. 26, 2020; the entire contents of which are incorporated herein by reference.

FIELD

Embodiments of the present invention relate to a substrate treatment apparatus and a manufacturing method of a semiconductor device.

BACKGROUND

One of steps of treating a substrate with a liquid chemical is an etching step in which the substrate is immersed in a high temperature liquid chemical stored in a tank. In such an etching step, the liquid chemical is sometimes agitated in the tank by ejecting the liquid chemical or bubbles from the bottom part of the tank. In this case, since the flow speed of the liquid chemical is high near ejection ports, this possibly causes in-plane difference in etching amount over the substrate.

DETAILED DESCRIPTION

Embodiments will now be explained with reference to the accompanying drawings. The present invention is not limited to the embodiments.

A substrate treatment apparatus according to an embodiment includes: a tank configured to store a liquid chemical with which a plurality of substrates are treated; a piping having an ejection port that ejects the liquid chemical or bubbles into the tank; a plurality of rods that support the plurality of substrates in the tank; and a converter that is provided in the plurality of rods or the tank and that converts vibration applied to each substrate by the liquid chemical or the bubbles ejected from the piping into rotation in one direction around a center of the substrate as a rotational axis.

First Embodiment

Figure 1:
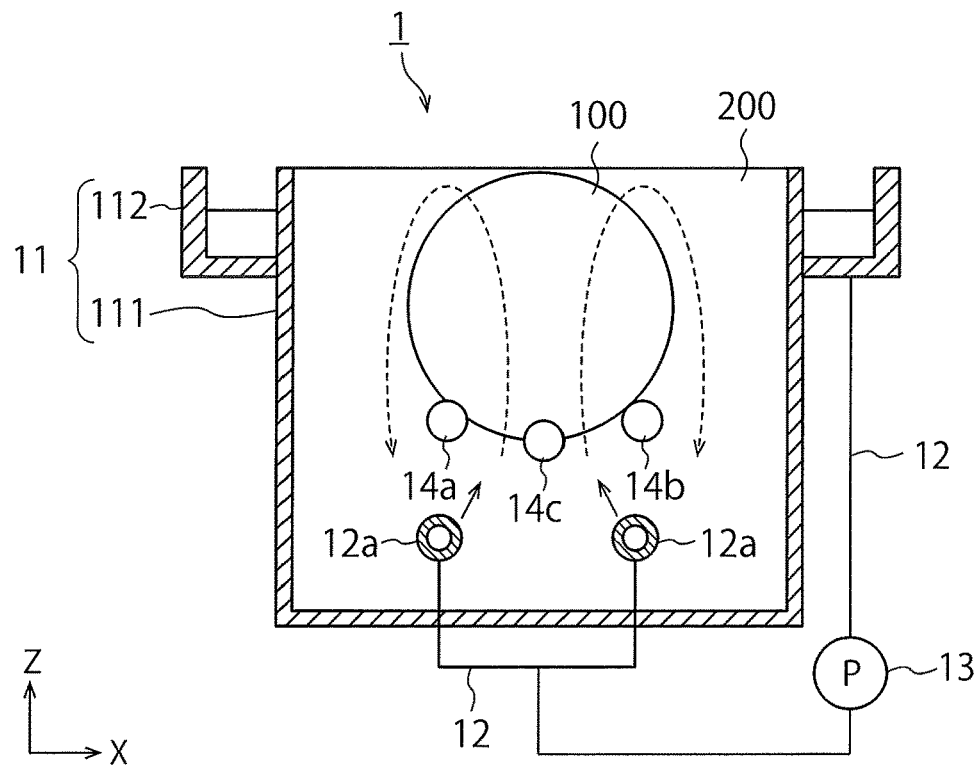
FIG. 1 is a schematic diagram of a substrate treatment apparatus according to a first embodiment.

FIG. 1 is a schematic diagram schematically showing a configuration of a substrate treatment apparatus according to a first embodiment. A substrate treatment apparatus 1 shown in FIG. 1 is a batch-type wet etching treatment apparatus which collectively, selectively etches silicon nitride films (not shown) formed on a plurality of semiconductor substrates 100 with a liquid chemical 200. The substrate treatment apparatus 1 according to the present embodiment includes a tank 11, piping 12, a pump 13, and a plurality of rods 14a to 14c.

The tank 11 has an inner tank 111 and an outer tank 112. The inner tank 111 stores the liquid chemical 200. In the present embodiment, the inner tank 111 stores a high temperature phosphoric acid solution heated at 150° C. to 170° C. The outer tank 112 recovers the liquid chemical 200 that overflows from the inner tank 111.

The piping 12 communicates with a bottom part of the outer tank 112 and a bottom part of the inner tank 111 to circulate the liquid chemical 200 between the inner tank 111 and the outer tank 112. The liquid chemical 200 flowing out to the outer tank 112 is circulated back to the inner tank 111 through ejection ports 12a of the piping 12.

The pump 13 is provided on the piping 12. The pump 13 sucks the liquid chemical 200 from the outer tank 112 and pressurizes the sucked liquid chemical 200. Thereby, the liquid chemical 200 recovered in the outer tank 112 is ejected into the inner tank 111 through the ejection ports 12a of the piping 12.

Figure 2:
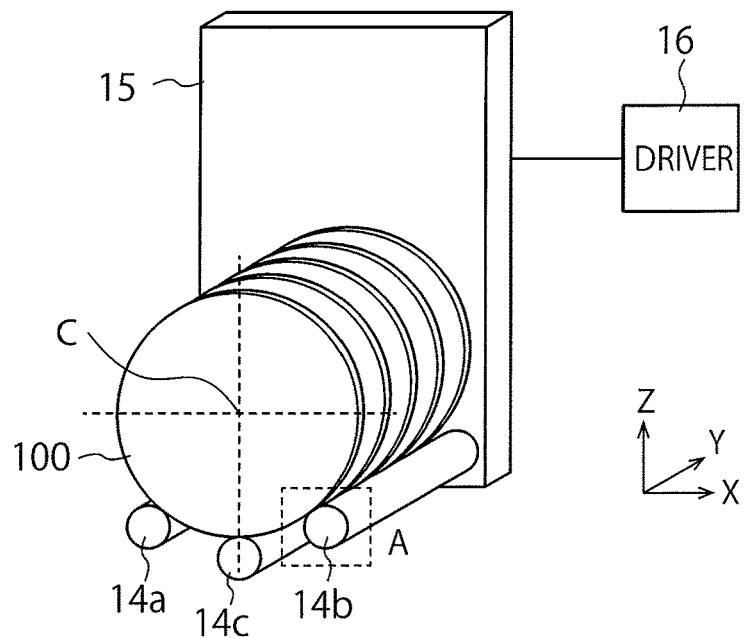
FIG. 2 is a perspective view briefly showing a mode of supporting semiconductor substrates.

FIG. 2 is a perspective view briefly showing a mode of supporting the semiconductor substrates 100. In the inner tank 111, the three rods 14a to 14c support the plurality of semiconductor substrates 100 arranged into a line in the Y-direction. The rods extend from a lifter 15 in the Y-direction and can be formed, for example, of quartz. The rod 14a and the rod 14b are arranged to be symmetric relative to a center axis extending through a center C of the semiconductor substrate 100 in the Z-direction. Moreover, the rod 14c is arranged on the aforementioned center axis between the rod 14a and the rod 14b.

The lifter 15 is driven by a driver 16. The driver 16 is constituted, for example, of a motor, a drive circuit for the motor, and the like. By elevating and lowering the lifter 15 in the Z-direction with the driver 16, the semiconductor substrates 100 supported on the rods 14a to 14c can be automatically carried in and carried out of the inner tank 111.

Figure 3:
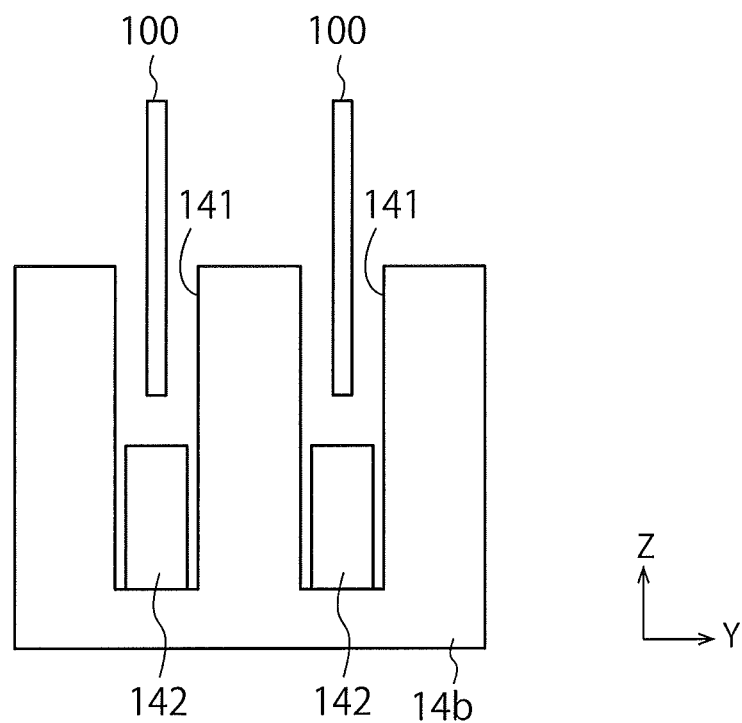
FIG. 3 is a lateral view having a region A shown in FIG. 2 enlarged.

FIG. 3 is a lateral view having a region A shown in FIG. 2 enlarged. As shown in FIG. 3, a plurality of recess portions 141 are provided along the Y-direction in the rod 14b. The semiconductor substrates 100 are inserted into the respective recess portions 141 one by one. A plurality of elastic bodies 142 are provided in a bottom part of each recess portion 141.

Figure 4:
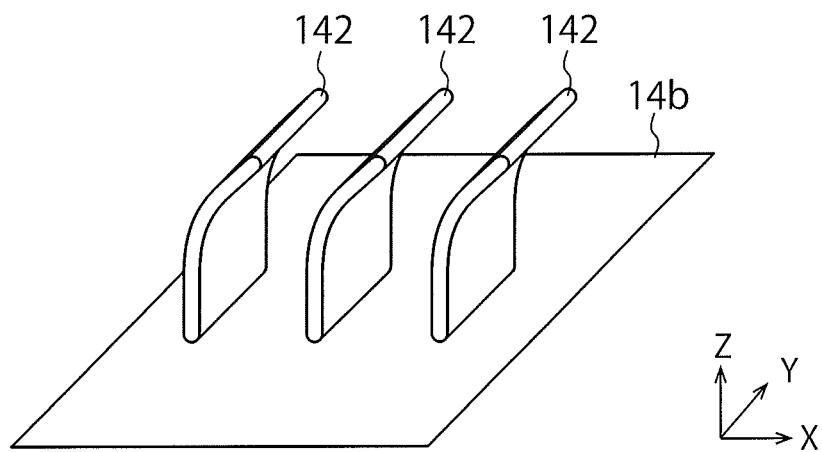
FIG. 4 is a perspective view having elastic bodies enlarged.

FIG. 4 is a perspective view having the elastic bodies 142 enlarged. The plurality of elastic bodies 142 are arranged along the X-direction perpendicular to the Y-direction and the Z-direction in the bottom part of each recess portion 141. The elastic bodies 142 are formed of elastic materials such as fluorine resin or rubber into a shape of fins.

Moreover, the elastic bodies 142 are inclined in a rotational direction from their lower end parts toward their upper end parts in order to rotate the semiconductor substrate 100 in one direction around a rotational axis which passes through its center C and extends in the Y-direction. The recess portions 141 and the elastic bodies 142 are also provided in the rod 14a and the rod 14c as well as in the rod 14b.

Hereafter, steps of manufacturing a semiconductor device using the substrate treatment apparatus 1 according to the present embodiment are described. Specifically, steps of manufacturing a three-dimensionally stacked semiconductor storage device in which electrode layers are stacked are partially described.

Figure 5A:
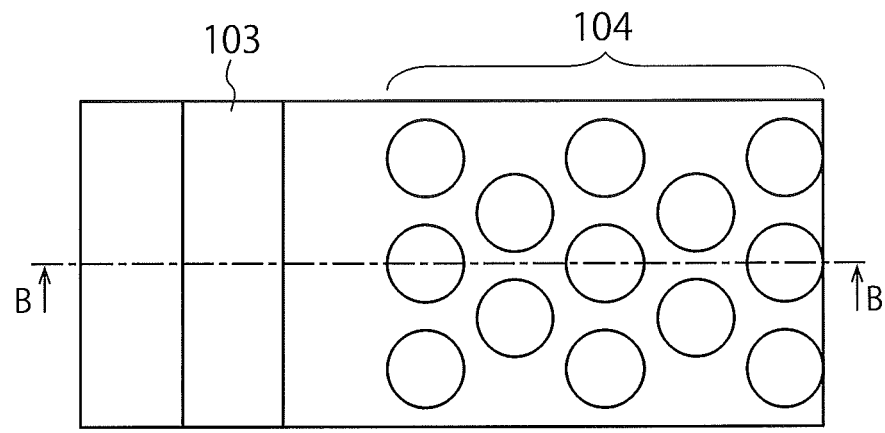
FIG. 5A is a plan view of a semiconductor device before etching.
Figure 5B:
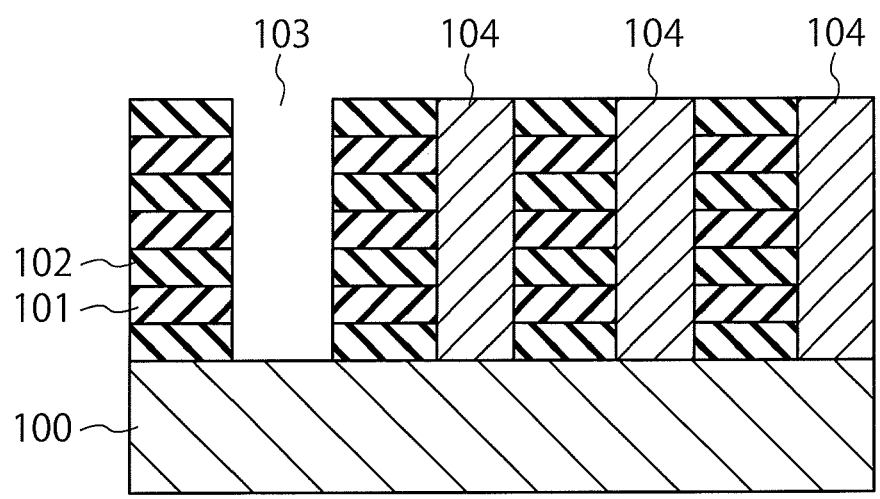
FIG. 5B is a cross sectional view taken along the sectional line B-B shown in FIG. 5A.
Figure 6:
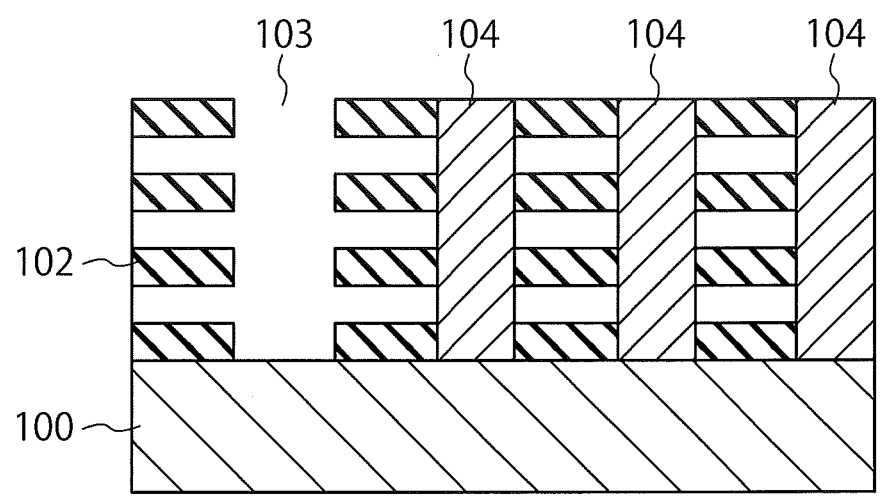
FIG. 6 is a cross sectional view of the semiconductor device after the etching.

FIG. 5A is a plan view of a semiconductor device before etching. FIG. 5B is a cross sectional view taken along the sectional line B-B shown in FIG. 5A. FIG. 6 is a cross sectional view of the semiconductor device after the etching.

As shown in FIG. 5B, silicon nitride films 101 and silicon oxide films 102 are alternately stacked on the semiconductor substrate 100. A stacked body composed of the silicon nitride films 101 and the silicon oxide films 102 is segmented by a slit 103. Moreover, a plurality of columnar memory films 104 are formed in the stacked body.

When the driver 16 drives the lifter 15 to immerse the semiconductor substrate 100 in the liquid chemical 200 stored in the inner tank 111, the liquid chemical 200 infiltrates into the stacked body through the slit 103. As a result, as in the cross sectional view shown in FIG. 6, the silicon nitride films 101 are selectively etched relative to the silicon oxide films 102. After completion of the etching of the silicon nitride films 101, the semiconductor substrate 100 is carried out of the inner tank 111 by the lifter 15. After that, conductive films, for example, containing tungsten (W) are deposited in portions obtained by etching the silicon nitride films 101. A part of the conductive films function as word lines.

Figure 7A:
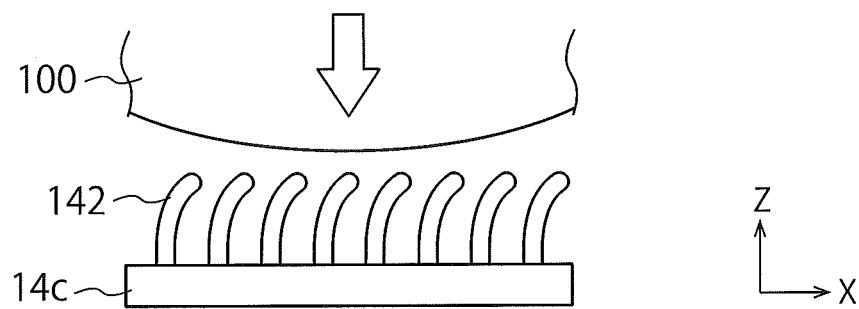
FIG. 7A is an elevational view showing a state where a semiconductor substrate descends.

Hereafter, motion of the semiconductor substrate 100 during the aforementioned etching of the silicon nitride films 101 is described with reference to FIG. 7A to FIG. 7C.

In the inner tank 111, flows of the liquid chemical 200 are generated between the bottom part and the upper part of the inner tank 111 by ejecting the liquid chemical 200 from the ejection ports 12a of the piping 12 (see FIG. 1). The flows of the liquid chemical 200 firstly cause, as shown in FIG. 7A, downward force in the vertical direction to be exerted on the semiconductor substrate 100.

Figure 7B:
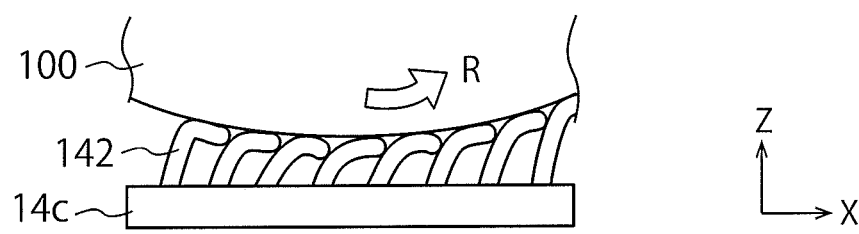
FIG. 7B is an elevational view showing a state where the semiconductor substrate rotates.

When the aforementioned force lowers the outer circumferential part of the semiconductor substrate 100 down to a position where the outer circumferential part comes into contact with the elastic bodies 142, the inclinations of the elastic bodies 142 cause the semiconductor substrate 100 to rotate along the inclinations of the elastic bodies 142 in a direction R as shown in FIG. 7B.

Figure 7C:
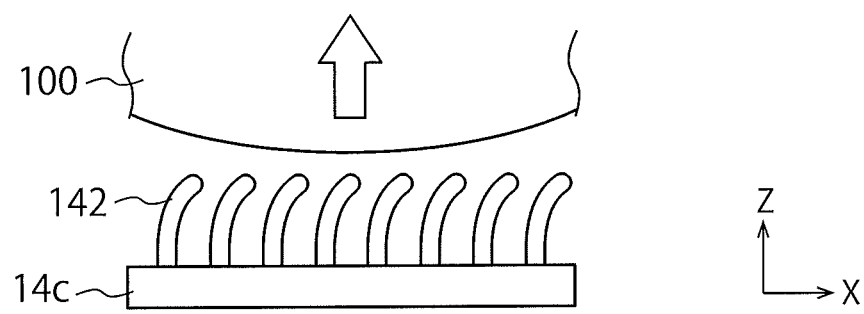
FIG. 7C is an elevational view showing a state where the semiconductor substrate rises.

Next, as shown in FIG. 7C, upward force in the vertical direction generated by the flows of the liquid chemical 200 elevates the semiconductor substrate 100. In this stage, the elastic bodies 142 are elastically deformed back to have the shapes shown in FIG. 7A. The rotation of the semiconductor substrate 100 shown in FIG. 7A to FIG. 7C is repeated afterward.

According to the present embodiment described above, a converter composed of the recess portions 141 and the elastic bodies 142 provided in the rods 14a to 14c converts vibration in the vertical direction applied to the semiconductor substrates 100 by the flows of the liquid chemical 200 into rotation of the semiconductor substrates 100 around the center C as the rotational axis. This consequently makes the flows of the liquid chemical 200 even since the whole surfaces of the semiconductor substrates 100 periodically pass through the vicinities of the ejection ports 12a where the flow speed of the liquid chemical 200 is high. Therefore, the silicon nitride films 101 are evenly etched over the semiconductor substrates 100.

Moreover, in the present embodiment, the semiconductor substrates 100 are rotated by a simple mechanism including the recess portions 141 and the elastic bodies 142, not by a large-scale mechanism such as a motor. Accordingly, it can be easy to improve in-plane evenness of a liquid chemical treatment of the semiconductor substrates 100.

Notably, in the present embodiment, the driver 16 may vibrate the lifter 15 in the vertical direction (Z-direction) and the horizontal direction (X-direction) during the etching treatment. In this case, since the driver 16 can adjust the amplitude and the frequency of the vibration of the semiconductor substrates 100, controllability of rotary motion of the semiconductor substrates 100 is improved.

Second Embodiment

A second embodiment is hereafter described. The present embodiment is different from the first embodiment in the structure of the rods 14a to 14c. Therefore, its differences from the first embodiment are hereafter mainly described.

Figure 8:
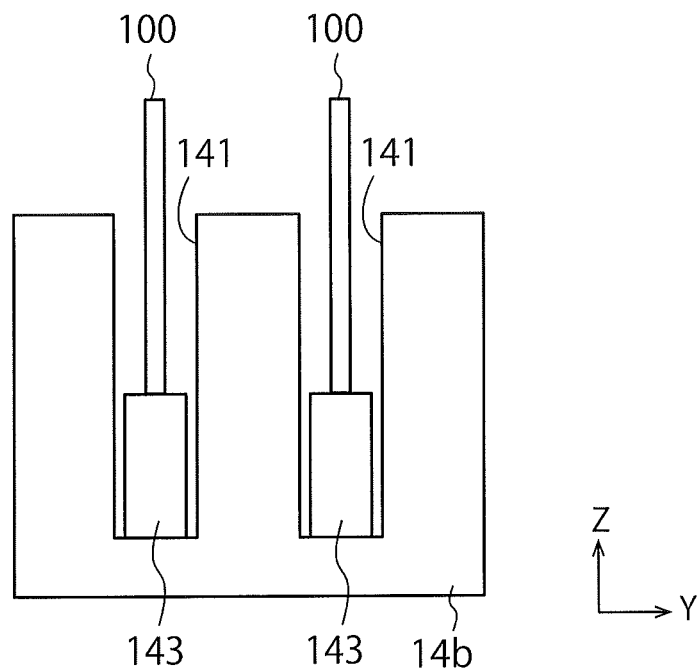
FIG. 8 is a lateral view having the main part of a substrate treatment apparatus according to a second embodiment enlarged.

FIG. 8 is a lateral view having the main part of a substrate treatment apparatus according to the second embodiment enlarged. FIG. 8 corresponds to the enlarged view of the region A shown in FIG. 2. As shown in FIG. 8, in the rod 14b according to the present embodiment, the plurality of recess portions 141 are provided along the Y-direction similarly to the first embodiment, and meanwhile, a plurality of projections 143 are provided in the bottom part of each recess portion 141.

Figure 9:
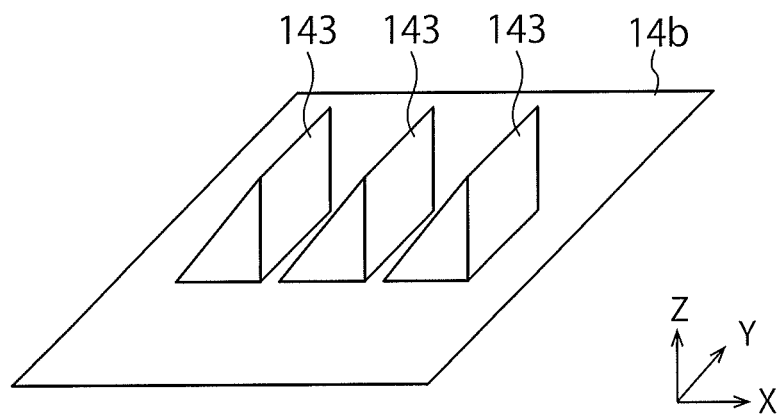
FIG. 9 is a perspective view having projections enlarged.

FIG. 9 is a perspective view having the projections 143 enlarged. The plurality of projections 143 are arranged along the X-direction in the bottom part of each recess portion 141. The projections 143 are formed of quartz or the like having durability against the liquid chemical 200 into a shape of a mountain range, for example. Moreover, inclined surfaces (ridges) of the projections 143 are inclined in the rotational direction in order to rotate the semiconductor substrates 100 in one direction. The projections 143 are also provided in the rod 14a and the rod 14c as well as in the rod 14b.

By the substrate treatment apparatus according to the present embodiment, the silicon nitride films 101 can also be selectively etched as described for the first embodiment. Hereafter, motion of the semiconductor substrate 100 during the aforementioned etching of the silicon nitride films 101 is described with reference to FIG. 10A to FIG. 10C.

Figure 10A:
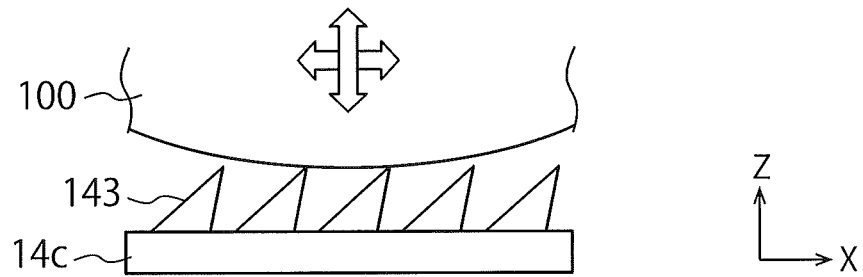
FIG. 10A is an elevational view showing a state where vibration is applied to a semiconductor substrate.

When the outer circumferential part of the semiconductor substrate 100 is in contact with top parts (tip parts) of the projections 143, the flows of the liquid chemical 200 generated between the bottom part and the upper part of the inner tank 111 cause vibration in the horizontal direction or the vertical direction to be applied to the semiconductor substrate 100 as shown in FIG. 10A.

Figure 10B:
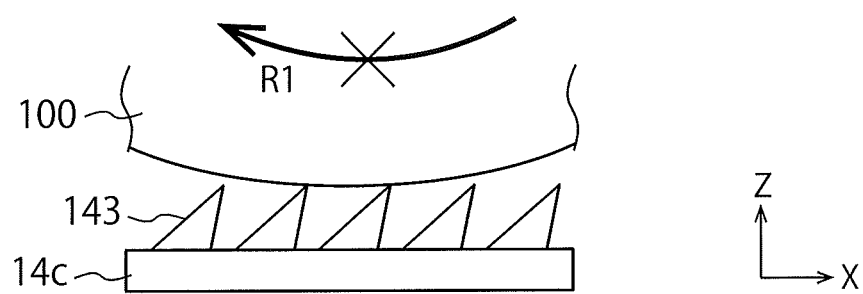
FIG. 10B is an elevational view showing a state where clockwise rotation of the semiconductor substrate is prevented.
Figure 10C:
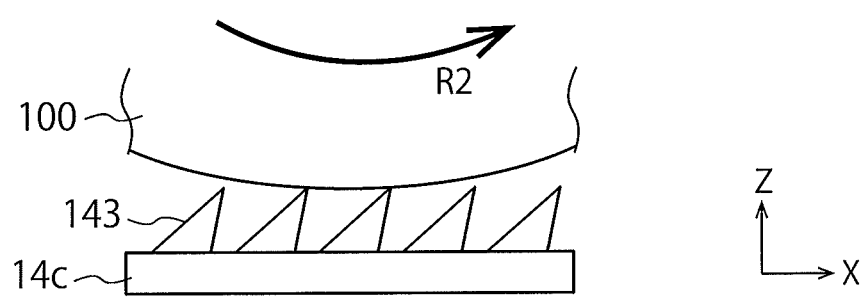
FIG. 10C is an elevational view showing a state where the semiconductor substrate rotates counterclockwise.

When the aforementioned vibration is applied to the semiconductor substrate 100, since the inclined surfaces of the projections 143 are inclined in the one direction, rotation of the semiconductor substrate 100 in a clockwise direction R1 reverse to the one direction is prevented as shown in FIG. 10B. Meanwhile, as shown in FIG. 10C, the projections 143 promote rotation of the semiconductor substrate 100 in a counterclockwise direction R2 same as the one direction. As above, the rotation of the semiconductor substrate 100 in the counterclockwise direction R2 is repeated.

According to the present embodiment described above, a converter composed of the recess portions 141 and the projections 143 provided in the rods 14a to 14c converts vibration in the vertical direction or the horizontal direction applied to the semiconductor substrates 100 by the flows of the liquid chemical 200 into rotation of the semiconductor substrates 100 around the center C as the rotational axis. This consequently makes the flows of the liquid chemical 200 even since the whole surfaces of the semiconductor substrates 100 periodically pass through the vicinities of the ejection ports 12a where the flow speed of the liquid chemical 200 is high. Therefore, the silicon nitride films 101 are evenly etched over the semiconductor substrates 100.

Moreover, also in the present embodiment, the aforementioned converter has a simple configuration including the recess portions 141 and the projections 143. Accordingly, it can be easy to improve in-plane evenness of a liquid chemical treatment of the semiconductor substrates 100.

Third Embodiment

A third embodiment is hereafter described. The present embodiment is different from the first embodiment in the arrangement of the rods 14a to 14c. Therefore, its differences from the first embodiment are hereafter mainly described.

Figure 11:
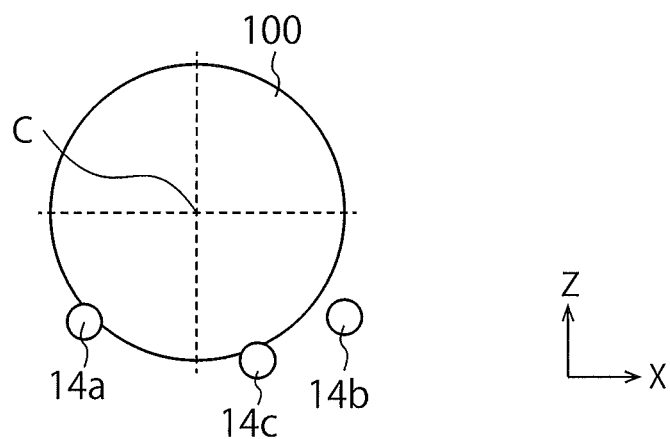
FIG. 11 is an elevational view showing the main part of a substrate treatment apparatus according to a third embodiment.

FIG. 11 is an elevational view showing the main part of a substrate treatment apparatus according to the third embodiment. In FIG. 11, the components of the substrate treatment apparatus other than the rods 14a to 14c are omitted from the illustration.

As shown in FIG. 11, in the present embodiment, the rod 14a and the rod 14b are arranged to be asymmetric relative to the center axis which passes through the center C of the semiconductor substrate 100 and extends in the Z-direction. Moreover, the rod 14c is arranged at a position displaced from the aforementioned center axis between the rod 14a and the rod 14b. Namely, the linear distance from the rod 14a to the rod 14c is different from the linear distance from the rod 14b to the rod 14c.

The arrangement and the configuration as above allow two rods of the rod 14a to the rod 14c to support the semiconductor substrate 100 simultaneously. It should be noted that the rod 14a and the rod 14b support the semiconductor substrate 100 at different times and the rod 14c supports the semiconductor substrate 100 simultaneously with one of the rod 14a and the rod 14b.

Figure 12:
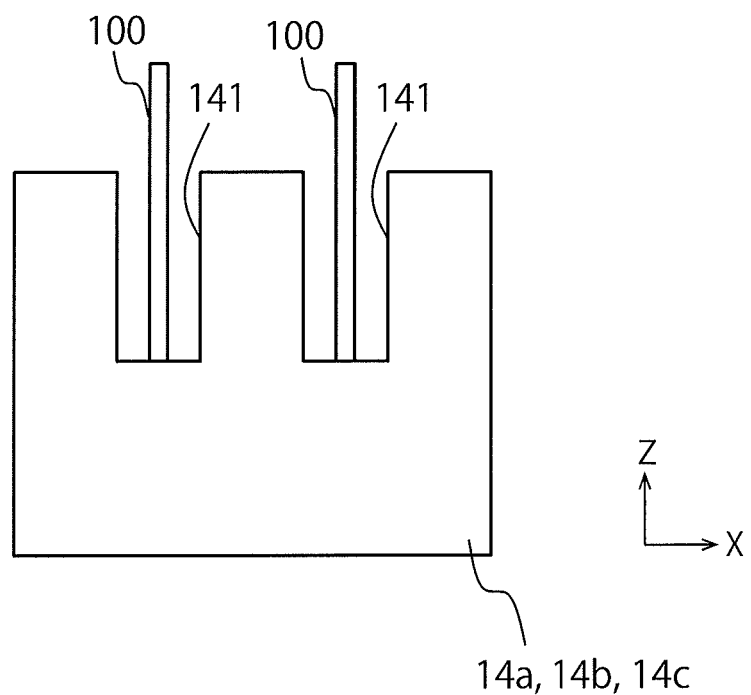
FIG. 12 is a lateral view of a rod.

FIG. 12 is a lateral view of the rods 14a to 14c. In the rods 14a to 14c shown in FIG. 12, the recess portions 141 described for the first embodiment are formed, and meanwhile, the elastic bodies 142 are not formed.

The substrate treatment apparatus according to the present embodiment can also selectively etch the silicon nitride films 101 described for the first embodiment. Hereafter, motion of the semiconductor substrate 100 during the aforementioned etching of the silicon nitride films 101 is described with reference to FIG. 13A to FIG. 13C.

Figure 13A:
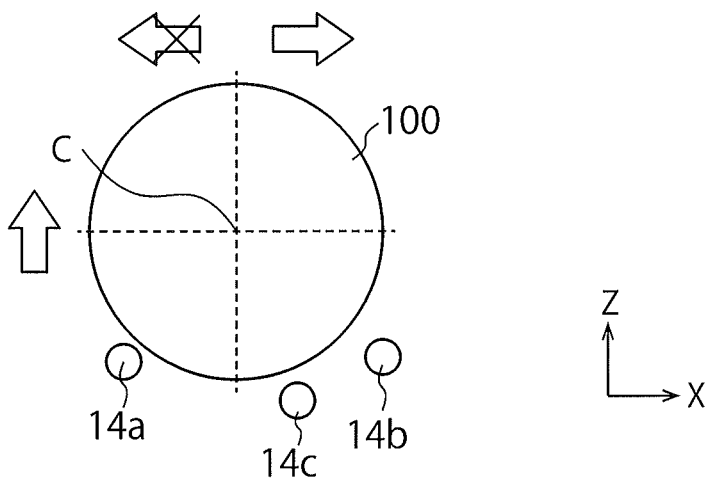
FIG. 13A is an elevational view showing a state where a semiconductor substrate floats.
Figure 13B:
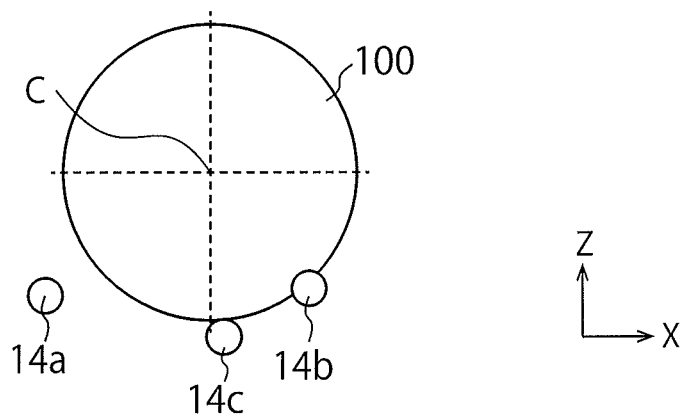
FIG. 13B is an elevational view showing a state where the semiconductor substrate moves horizontally.

When an upward flow of the liquid chemical 200 in the vertical direction is generated in the inner tank 111 when the rod 14a and the rod 14c are in contact with the outer circumferential part of the semiconductor substrate 100 (see FIG. 11), the semiconductor substrate 100 floats (is elevated), as shown in FIG. 13A, to such an extent that it does not escape from the recess portion 141. In this stage, a horizontal motion of the semiconductor substrate 100 in the −X-direction (to the left in FIG. 13A) is prevented by the rod 14a. Therefore, as shown in FIG. 13B, the semiconductor substrate 100 horizontally moves in the +X-direction (to the right in FIG. 13A) and is to be supported on the rod 14b and the rod 14c.

Figure 13C:
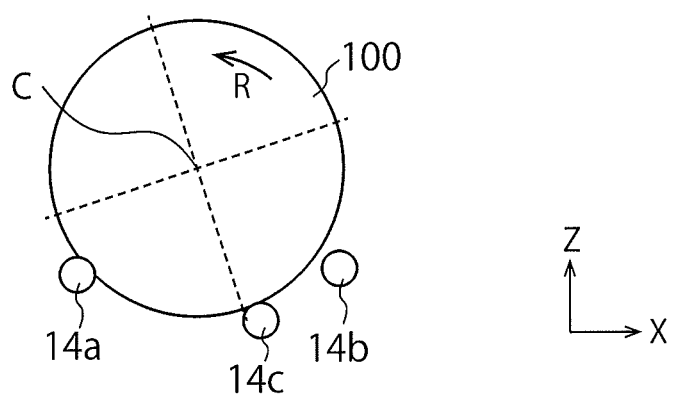
FIG. 13C is an elevational view showing a state where the semiconductor substrate rotates.

Since the distance between the rod 14b and the rod 14c is shorter than the distance between the rod 14a and the rod 14c, the semiconductor substrate 100 becomes unstable. This causes the semiconductor substrate 100 to rotate in the direction R and to be supported again on the rod 14a and the rod 14c. The rotation of the semiconductor substrate 100 shown in FIG. 13A to FIG. 13C is repeated afterward.

According to the present embodiment described above, a converter composed of the three rods 14a to 14c converts vibration in the vertical direction applied to the semiconductor substrates 100 by the flows of the liquid chemical 200 into rotation of the semiconductor substrates 100 while their motion in the horizontal direction occurs between the vibration and the rotation. This consequently makes the flows of the liquid chemical 200 even since the whole surfaces of the semiconductor substrates 100 periodically pass through the vicinities of the ejection ports 12a where the flow speed of the liquid chemical 200 is high. Therefore, the silicon nitride films 101 are evenly etched over the semiconductor substrates 100.

Moreover, in the present embodiment, the elastic bodies 142 do not need to be provided in the bottom parts of the recess portions 141 of the rods. Accordingly, the converter which converts the vibration of the semiconductor substrates 100 into the rotation can be simpler.

First Modification

Figure 14:
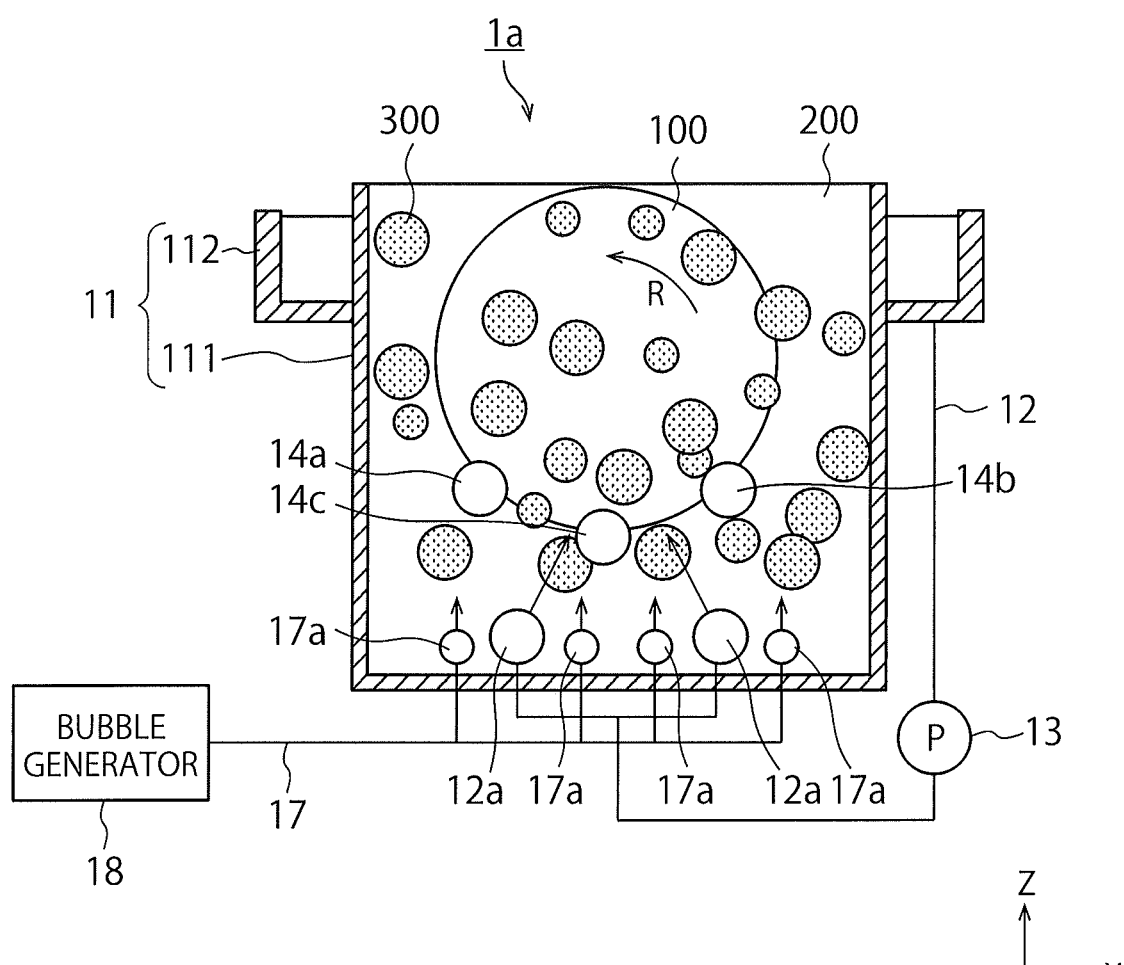
FIG. 14 is a schematic diagram schematically showing a configuration of a substrate treatment apparatus according to a first modification.

FIG. 14 is a schematic diagram schematically showing a configuration of a substrate treatment apparatus according to a first modification. Its similar components to those of the substrate treatment apparatus 1 shown in FIG. 1 are given the same signs and their detailed description is omitted.

A substrate treatment apparatus 1a according to the present modification further includes piping 17 (second piping) and a bubble generator 18 in addition to the aforementioned components of the substrate treatment apparatus 1. Ejection ports 17a communicating with the inner tank 111 are provided on one side of the piping 17. The ejection ports 17a are arranged in the bottom part of the inner tank 111 similarly to the ejection ports 12a on the piping 12 (first piping). Note that the number of ejection ports 17a is not specially limited while FIG. 14 shows the four ejection ports 17a.

The bubble generator 18 causes nitrogen gas to flow into the piping 17. Ejection of this nitrogen gas from the ejection ports 17a generates bubbles 300 in the liquid chemical 200. Since the bubbles 300 along with the liquid chemical 200 ejected from the ejection ports 12a agitate the liquid chemical 200 in the inner tank 111, the semiconductor substrates 100 easily vibrate. The vibration of the semiconductor substrates 100 is converted into rotation of the semiconductor substrates 100 by any of the converters which have been described for the first embodiment to the third embodiment and are provided in the rods 14a to 14c (the recess portions 141, the elastic bodies 142, the projections 143).

In the present modification, the bubble generator 18 may regulate gas flow rates. For example, when the gas flow rates are raised in the order from the ejection port 17a that is arranged on the left side in FIG. 14 to the ejection port 17a that is arranged on the right side in FIG. 14, the semiconductor substrates 100 can easily rotate in the direction R since more bubbles 300 are generated in the ejection port 17a on the right side.

According to the present embodiment described above, the bubble generator 18 generates the bubbles 300 in the liquid chemical 200, and thereby, can assist the vibration of the semiconductor substrates 100. Moreover, the bubble generator 18 may control places where the bubbles 300 are generated, and thereby, can also assist the rotation of the semiconductor substrates 100.

Second Modification

Figure 15:
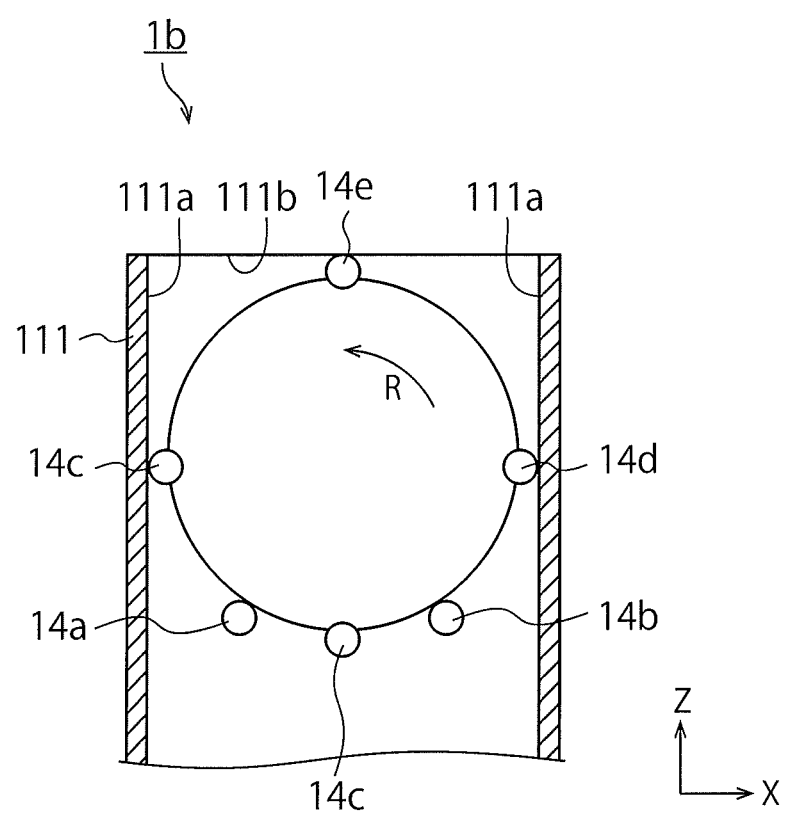
FIG. 15 is an elevational view showing the main part of a substrate treatment apparatus according to a second modification.

FIG. 15 is an elevational view showing the main part of a substrate treatment apparatus according to a second modification. A substrate treatment apparatus 1b according to the present modification further includes rods 14c to 14e. Note that the substrate treatment apparatus 1b does not need to include all the rods of the rods 14c to 14e and may include at least one of these rods. In FIG. 15, the components of the substrate treatment apparatus 1b other than the rods 14a to 14e are omitted from the illustration.

The rods 14c to 14e have the same structures as those of the rods 14a to 14c described for the first embodiment or the second embodiment. Namely, the plurality of recess portions 141 are formed in the rods 14c to 14e, and the plurality of elastic bodies 142 or the plurality of projections 143 are provided in the bottom part of each recess portion 141.

The rod 14c and the rod 14d are provided on inner surfaces 111a of the inner tank 111, and face each other in the X-direction. Meanwhile, the rod 14e is provided on a lid part 111b of the inner tank 111, and faces the rod 14c in the Z-direction. When the outer circumferential part of the semiconductor substrate 100 comes into contact with the elastic bodies 142 or the projections 143 provided in the rods 14c to 14e, the elastic bodies 142 or the projections 143 rotate the semiconductor substrate 100 in the direction R.

Therefore, according to the present modification, the number of converters which convert the vibration of the semiconductor substrate 100 into the rotation thereof increases more than in the first embodiment and in the second embodiment. The semiconductor substrate 100 thereby rotates more smoothly and it is possible to improve evenness of the liquid chemical treatment more.

Third Modification

Figure 16:
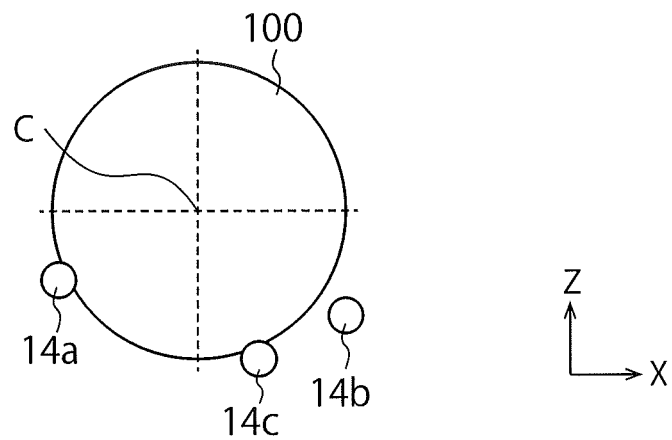
FIG. 16 is an elevational view showing the main part of a substrate treatment apparatus according to a third modification.

FIG. 16 is an elevational view showing the main part of a substrate treatment apparatus according to a third modification. In FIG. 16, the components of the substrate treatment apparatus other than the rods 14a to 14c are omitted from the illustration.

In the present modification, similarly to the third embodiment, the rod 14a and the rod 14b are arranged to be asymmetric relative to the center C of the semiconductor substrate 100. Moreover, the rod 14c is arranged at a position displaced from the aforementioned center axis between the rod 14a and the rod 14b. Namely, the linear distance from the rod 14a to the rod 14c is different from the linear distance from the rod 14b to the rod 14c.

It should be noted that in the present modification, the height (distance in the Z-direction) from the rod 14c to the rod 14a is different from the height from the rod 14c to the rod 14b. Also with such an arrangement and a configuration, the rod 14a and the rod 14b out of the rod 14a to the rod 14c can support the semiconductor substrate 100 at different times and the rod 14c can support the semiconductor substrate 100 simultaneously with one of the rod 14a and the rod 14b.

Accordingly, also in the present modification, similarly to the third embodiment, the rod 14a to the rod 14c can convert vibration in the vertical direction applied to the semiconductor substrates 100 into rotation of the semiconductor substrates 100 while their motion in the horizontal direction occurs between the vibration and the rotation. This can make the liquid chemical treatment of the surfaces of the semiconductor substrates 100 even.

Fourth Modification

Figure 17:
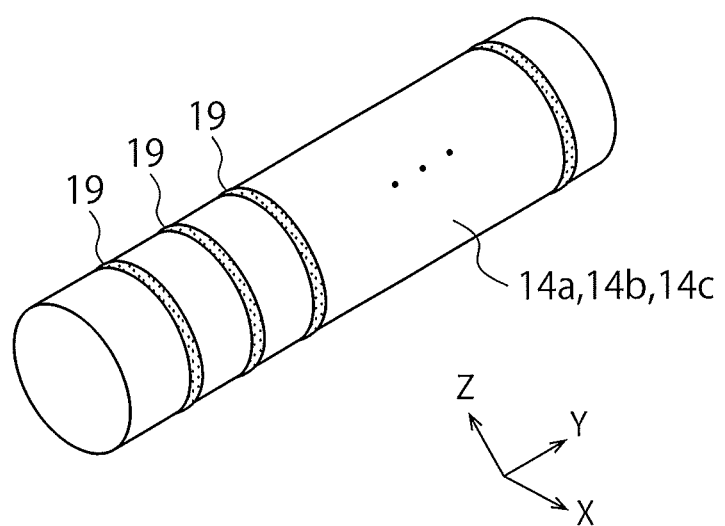
FIG. 17 is a perspective view showing the main part of a substrate treatment apparatus according to a fourth modification.

FIG. 17 is a perspective view showing the main part of a substrate treatment apparatus according to a fourth modification. According to the aforementioned third embodiment, the semiconductor substrates 100 are supported by two rods. This tends to cause the semiconductor substrates 100 to be unstably supported.

Therefore, in the present modification, as shown in FIG. 17, slip-resistant sheets 19 are pasted on parts of outer circumferential surfaces of the columnar rods 14a to 14c. The slip-resistant sheets 19 are formed of materials larger in frictional coefficient than those of the rods 14a to 14c. Thereby, the semiconductor substrates 100 and the contact portions of the rods 14a to 14c scarcely slip on each other.

Therefore, according to the present modification, stability in supporting the semiconductor substrates 100 is improved, and hence, the semiconductor substrates 100 are allowed to move smoothly, horizontally and rotationally.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
   a tank configured to store a liquid chemical with which a plurality of substrates are treated;
   a piping having an ejection port that ejects the liquid chemical or bubbles into the tank;
   a plurality of rods that support the plurality of substrates in the tank; and
   a converter that is provided in the plurality of rods or the tank and that converts vibration applied to each substrate by the liquid chemical or the bubbles ejected from the piping into rotation in one direction around a center of the substrate as a rotational axis, wherein
   the converter includes
      a plurality of recess portions provided along an arrangement direction of the plurality of substrates in each rod, and
      a plurality of projections provided in a bottom part of each recess portion and inclined in the one direction, the projections being in a shape of a mountain range.

2. A substrate treatment apparatus comprising:
   a tank configured to store a liquid chemical with which a plurality of substrates are treated;
   a piping having an ejection port that ejects the liquid chemical or bubbles into the tank;
   a plurality of rods that support the plurality of substrates in the tank; and
   a converter that is provided in the plurality of rods or the tank and that converts vibration applied to each substrate by the liquid chemical or the bubbles ejected from the piping into rotation in one direction around a center of the substrate as a rotational axis, wherein
   the converter includes
      a first rod that is one of the plurality of rods,
      a second rod that is arranged to be asymmetric with respect to the first rod relative to a center of the substrate and supports the plurality of substrates at a different time from that when the first rod does, and
      a third rod that is arranged between the first rod and the second rod and supports the plurality of substrates simultaneously with one of the first rod and the second rod.

3. The substrate treatment apparatus according to claim 2, wherein a linear distance from the first rod to the third rod is different from a linear distance from the second rod to the third rod.

4. The substrate treatment apparatus according to claim 2, wherein a slip-resistant sheet is pasted on a part of an outer circumferential surface of each of the first rod, the second rod and the third rod.

* * * * *